US008383500B2

(12) United States Patent
Marxsen et al.

(10) Patent No.: US 8,383,500 B2
(45) Date of Patent: Feb. 26, 2013

(54) SEMICONDUCTOR DEVICE FORMED BY A REPLACEMENT GATE APPROACH BASED ON AN EARLY WORK FUNCTION METAL

(75) Inventors: Gerd Marxsen, Radebeul (DE); Joachim Metzger, Butzbach (DE); Robert Binder, Dresden (DE); Markus Lenski, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 79 days.

(21) Appl. No.: 12/914,234

(22) Filed: Oct. 28, 2010

(65) Prior Publication Data

US 2011/0186931 A1 Aug. 4, 2011

(30) Foreign Application Priority Data

Jan. 29, 2010 (DE) .................. 10 2010 001 406

(51) Int. Cl.
*H01L 21/3205* (2006.01)
(52) U.S. Cl. ................... 438/585; 438/230; 438/275
(58) Field of Classification Search .......... 438/585, 438/230, 275
See application file for complete search history.

(56) References Cited

U.S. PATENT DOCUMENTS

| 2007/0215950 A1 | 9/2007 | Aoyama |
| 2008/0157212 A1 | 7/2008 | Lavoie et al. |
| 2009/0230479 A1 | 9/2009 | Hsu et al. |
| 2009/0275179 A1* | 11/2009 | Basker et al. ............. 438/231 |
| 2010/0072523 A1 | 3/2010 | Sato et al. |

FOREIGN PATENT DOCUMENTS

| EP | 1 959 491 A2 | 8/2008 |
| JP | 2009-224386 A | 10/2009 |

OTHER PUBLICATIONS

Translation of Official Communication from German Patent Application 10 2010 001 406.0 dated Nov. 3, 2010.

* cited by examiner

*Primary Examiner* — Long Pham
(74) *Attorney, Agent, or Firm* — Williams, Morgan & Amerson, P.C.

(57) ABSTRACT

In a replacement gate approach, one work function metal may be provided in an early manufacturing stage, i.e., upon depositing the gate layer stack, thereby reducing the number of deposition steps required in a later manufacturing stage. Consequently, the further work function metal and the electrode metal may be filled into the gate trenches on the basis of superior process conditions compared to conventional replacement gate approaches.

20 Claims, 6 Drawing Sheets

SEMICONDUCTOR DEVICE FORMED BY A REPLACEMENT GATE APPROACH BASED ON AN EARLY WORK FUNCTION METAL

BACKGROUND OF THE INVENTION

1. Field of the Invention

Generally, the present disclosure relates to the fabrication of sophisticated integrated circuits including transistor elements comprising highly capacitive gate structures on the basis of a high-k dielectric material.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, CMOS technology is one of the most promising approaches due to the superior characteristics in view of operating speed and/or power consumption and/or cost efficiency. During the fabrication of complex integrated circuits using, for instance, CMOS technology, millions of transistors, i.e., N-channel transistors and P-channel transistors, are formed on a substrate including a crystalline semiconductor layer. A field effect transistor, irrespective of whether an N-channel transistor or a P-channel transistor is considered, typically comprises so-called PN junctions that represent an interface formed by highly doped regions, referred to as drain and source regions, and a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity, is a dominant design criterion for accomplishing an increase in the operating speed of the integrated circuits.

Presently, the vast majority of integrated circuits are based on silicon due to substantially unlimited availability, the well-understood characteristics of silicon and related materials and processes and the experience gathered during the last 50 years. Therefore, silicon will likely remain the material of choice for future circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows performing subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a base material of a gate insulation layer that separates the gate electrode, frequently comprised of polysilicon or metal-containing materials, from the silicon channel region. In steadily improving device performance of field effect transistors, the length of the channel region has been continuously decreased to improve switching speed and drive current capability. It turns out that decreasing the channel length requires an increased capacitive coupling between the gate electrode and the channel region to avoid the so-called short channel behavior during transistor operation. The short channel behavior may lead to an increased leakage current and to a pronounced dependence of the threshold voltage on the channel length. Aggressively scaled transistor devices with a relatively low supply voltage and thus reduced threshold voltage may suffer from an exponential increase of the leakage current while also requiring enhanced capacitive coupling of the gate electrode to the channel region. Thus, the thickness of the silicon dioxide layer has to be correspondingly decreased to provide the required capacitance between the gate and the channel region. For example, a channel length of approximately 0.08 µm may require a gate dielectric made of silicon dioxide as thin as approximately 1.2 nm. Although, generally, usage of high speed transistor elements having an extremely short channel may be substantially restricted to high speed signal paths, whereas transistor elements with a longer channel may be used for less critical signal paths, the relatively high leakage current caused by direct tunneling of charge carriers through an ultra-thin silicon dioxide gate insulation layer may reach values for an oxide thickness in the range of 1-2 nm that may not be compatible with thermal design power requirements for performance driven circuits.

Therefore, replacing silicon dioxide based dielectrics, at least in part, as the material for gate insulation layers has been considered, particularly for extremely thin silicon dioxide based gate layers. Possible alternative materials include materials that exhibit a significantly higher permittivity so that a physically greater thickness of a correspondingly formed gate insulation layer provides a capacitive coupling that would otherwise be obtained by an extremely thin silicon dioxide layer.

Additionally, transistor performance may be increased by providing an appropriate conductive material for the gate electrode so as to replace the usually used polysilicon material, at least in the vicinity of the gate dielectric material, since polysilicon may suffer from charge carrier depletion near the interface to the gate dielectric, thereby reducing the effective capacitance between the channel region and the gate electrode. Thus, a gate stack has been suggested in which a high-k dielectric material provides enhanced capacitance, while maintaining leakage currents at an acceptable level. On the other hand, the non-polysilicon material, such as titanium nitride and the like, in combination with other metals, may be formed so as to connect to the high-k dielectric material, thereby substantially avoiding the presence of a depletion zone and providing superior conductivity compared to the doped polysilicon material. Since the threshold voltage of the transistors, which represents the voltage at which a conductive channel forms in the channel region, is significantly determined by the work function of the metal-containing gate material, an appropriate adjustment of the effective work function with respect to the conductivity type of the transistor under consideration and the performance characteristics thereof has to be guaranteed.

Providing different metal species for adjusting the work function of the gate electrode structures for P-channel transistors and N-channel transistors at an early manufacturing stage may, however, be associated with a plurality of difficulties, which may stem from the fact that a complex patterning sequence may be required during the formation of the sophisticated high-k metal gate stack, which may result in a significant variability of the geometry of the gate electrode structures and of the resulting work function and thus threshold voltage of the completed transistor structures. Moreover, during a corresponding manufacturing sequence, the high-k material may be exposed to oxygen, which may result in an increase of layer thickness and thus a reduction of the capacitive coupling. In other approaches, appropriate work function metals may be diffused into the gate dielectric material prior to actually patterning the gate electrode structures, thereby placing dipole charges in the gate dielectric material as required for adjusting the desired work function for the different transistors types. Hence, during the further processing, a pronounced temperature dependency may require a strict control of the thermal budget, which in turn may contribute to an increased variability of the transistor characteristics. Furthermore, frequently, the channel region of one type of transistor may require a band gap offset compared to a pure silicon channel in order to obtain a desired work function on the basis of a specific work function metal, such as aluminum for P-channel transistors, wherein, however, the adjustment of the band gap offset is typically accomplished by epitaxially forming a semiconductor material, such as a silicon/germanium mixture in the channel region, which in turn necessitates well-controlled processes that may reduce overall throughput.

For these reasons, in other approaches, the initial gate electrode stack may be provided with a high degree of compatibility with conventional polysilicon-based process strategies and at least the deposition of the actual electrode metal and the final adjustment of the work function of the transistors are accomplished in a very advanced manufacturing stage, i.e., after completing the basic transistor structure. In a corresponding replacement gate approach, the high-k dielectric material may be formed and covered by an appropriate metal-containing material, such as titanium nitride and the like, followed by a standard polysilicon or amorphous silicon material, which may then be patterned on the basis of well-established advanced lithography and etch techniques. Consequently, during the process sequence for patterning the gate electrode structure, the sensitive high-k dielectric material may be protected by the metal-containing material, possibly in combination with sophisticated sidewall spacer structures, thereby substantially avoiding any undue material modification during the further processing. After patterning the gate electrode structure, conventional and well-established process techniques for forming the drain and source regions having the desired complex dopant profile are typically performed. After any high temperature processes, the further processing is continued, for instance by forming a metal silicide, if required, followed by the deposition of an interlayer dielectric material, such as silicon nitride in combination with silicon dioxide and the like. In this manufacturing stage, a top surface of the gate electrode structures embedded in the interlayer dielectric material is exposed, for instance by chemical mechanical polishing (CMP) and the like. The polysilicon material is removed in a selective etch process and, thereafter, an appropriate masking regime is applied in order to selectively fill in an appropriate work function metal for each type of transistor, which may be accomplished by filling in the first metal species and selectively removing the metal species from one of the gate electrode structures. Thereafter, a further metal material is deposited, thereby obtaining the desired work function for each type of transistor. Finally, the gate electrodes are filled with an electrode metal, thereby providing a full metal gate electrode structure for N-channel and P-channel transistors.

Although, in general, this approach may provide advantages in view of reducing process-related non-uniformities in the threshold voltages of the transistors since the high-k dielectric material may be reliably encapsulated during the entire process sequence without requiring an adjustment of the work function and thus the threshold voltage at an early manufacturing stage, the complex process sequence for removing the placeholder material and providing appropriate work function materials for the different types of transistors may also result in a significant degree of variability of the transistor characteristics, which may thus result in offsetting at least some of the advantages obtained by the common processing of the gate electrode structures until the basic transistor configuration is completed.

In other words, upon continuously shrinking the feature sizes and, thus, the gate length of the transistors, forming the gate openings or trenches formed upon removing the placeholder polysilicon material in the advanced manufacturing stage requires very sophisticated deposition techniques for depositing the first work function metal and depositing the second work function metal after removing the first work function metal from one of the gate trenches. Subsequently, the actual electrode material is to be filled in the gate trenches. Consequently, any deposition-related irregularities, such as voids and seams, for instance created in the actual electrode metal, may result in significant variations of electrical performance of the gate electrode structures. Furthermore, upon applying sophisticated deposition techniques for filling in the work function metals, for instance by establishing deposition conditions, in which preferably deposition may occur at the bottom of the gate trenches compared to the sidewall surface areas, any variations in thickness may, thus, result in significant threshold voltage variations. Moreover, upon applying any such sophisticated deposition techniques, it may be very difficult to appropriately adjust the work function values by depositing a desired specific thickness at the bottom of a gate trench under consideration. Generally, reducing the thickness of the work function metal so as to provide superior deposition conditions may, thus, not be a promising option in view of obtaining the desired work function of the gate electrode structures. Consequently, upon further device scaling, the deposition-related variations of transistor characteristics may increase in conventional replacement gate approaches.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure generally provides manufacturing techniques and semiconductor devices in which the number of deposition processes to be applied in a replacement gate approach in a very late manufacturing stage may be reduced by providing the work function metal of one type of transistors upon forming a gate layer stack. Consequently, the patterning of the gate layer stack may be accomplished with process conditions, which may be substantially equal for P-channel transistors and N-channel transistors, for instance in view of the material composition of the various material layers of the gate layer stack. Hence, reduced variability of the overall lateral dimensions of the resulting gate electrode structures may be achieved. Moreover, in a late manufacturing stage, the placeholder material may be efficiently removed in both types of gate electrode structures, wherein the exposed work function metal may be selectively removed in one type of gate electrode structures and replaced by another appropriate work function metal. Consequently, the number of deposition processes required for providing the work function metals for different transistor types may be reduced in this manufacturing stage, thereby providing superior deposition conditions for the second work function metal and also for the actual electrode metal.

One illustrative method disclosed herein comprises forming a first gate electrode structure of a first transistor and a second gate electrode structure of a second transistor from a gate layer stack that comprises a semiconductor material, a high-k dielectric material and a first work function metal layer for adjusting a work function of the first gate electrode structure. The method further comprises removing the semiconductor material from the first and second gate electrode structures so as to expose the first work function metal layer in the first and second gate electrode structures. Additionally, the method comprises removing the first work function metal layer from the second gate electrode structure and forming a second work function metal layer in the second gate electrode structure. Furthermore, the method comprises forming a conductive electrode material in the first and second gate electrode structures after providing the second work function metal layer.

A further illustrative method disclosed herein relates to forming a semiconductor device. The method comprises forming a gate layer stack above a first active region of a first transistor and above a second active region of a second transistor, wherein the gate layer stack comprises a high-k gate dielectric material and a first work function metal formed on the high-k dielectric material. The method additionally comprises forming a first gate electrode structure on the first active region and a second gate electrode structure on the second active region from the gate layer stack. Moreover, the method comprises replacing the first work function metal in the second gate electrode structure with a second work function metal that differs from the first work function metal. Additionally, the method comprises forming an electrode metal in the first and second gate electrode structures.

One illustrative semiconductor device disclosed herein comprises a first transistor comprising a first gate electrode structure. The first gate electrode structure comprises a first gate insulation layer including a high-k dielectric material, a first work function metal formed on the gate insulation layer and an electrode metal that is formed above the first work function metal. Additionally, the semiconductor device comprises a second transistor comprising a second gate electrode structure. The second gate electrode structure comprises a second gate insulation layer including the high-k dielectric material and comprises a second work function metal formed on the second gate insulation layer and also comprises the electrode metal that is formed on the second work function metal.

BRIEF DESCRIPTION OF THE DRAWINGS

The disclosure may be understood by reference to the following description taken in conjunction with the accompanying drawings, in which like reference numerals identify like elements, and in which.

Figure 1A:
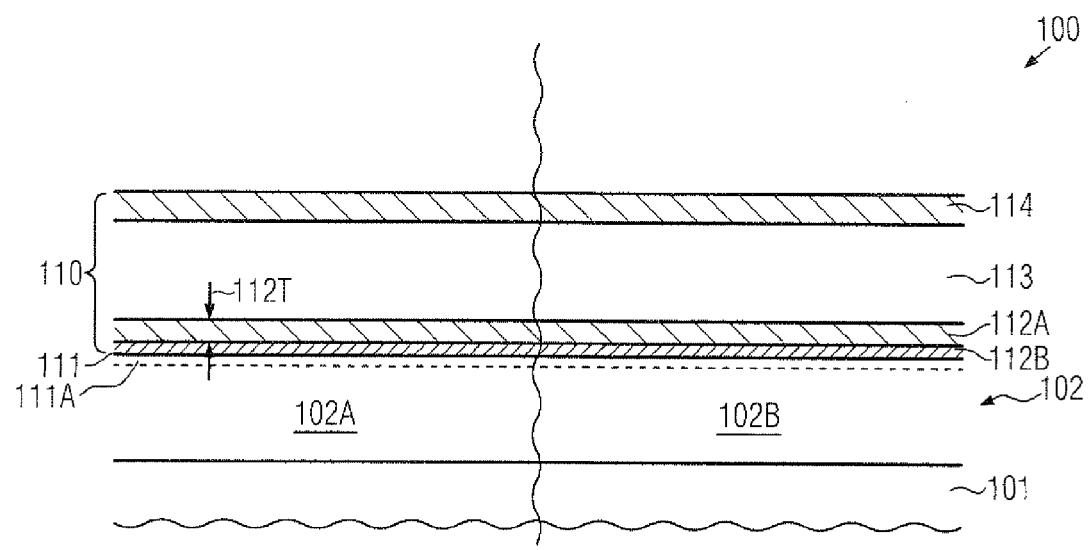
FIGS. 1a-1k schematically illustrate cross-sectional views of a semiconductor device during various manufacturing stages in forming high-k metal gate electrode structures by applying a replacement gate approach on the basis of a gate layer stack that has incorporated therein the work function metal of one type of transistors, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides manufacturing techniques and semiconductor devices in which the gate electrode structures of N-channel transistors and P-channel transistors may be provided in the form of full metal gate electrode structures, wherein the electrode metal may be provided in a very late manufacturing stage based on a replacement gate approach. Furthermore, the gate electrode structures may be formed on the basis of a gate layer stack that comprises the work function metal of one type of transistors, thereby providing superior process conditions upon forming the gate layer stack and patterning the same, since the same or at least very similar conditions may be encountered for the P-channel transistors and the N-channel transistors in this manufacturing stage. For example, the gate electrode structures, which require a moderately thick work function metal species, such as aluminum and the like, may be formed on the basis of the gate layer stack having incorporated therein the "thick" work function metal layer, thereby enabling the adjustment of the work function by using the appropriate thickness for a material under consideration, while the work function metal of the other type of transistors, such as N-channel transistors, may be provided in a very late manufacturing stage. In this case, the reduced thickness required for these gate electrode structures may contribute to superior deposition conditions. Consequently, the actual electrode metal, such as aluminum and the like, may then be filled into the corresponding gate openings or trenches in a common fill process, wherein the width of the gate opening of the gate electrode structure requiring the work function metal of increased thickness may not be affected by the required increased thickness of this material. Therefore, the superior deposition conditions may provide enhanced uniformity of transistor characteristics and may also provide the capability of further scaling device dimensions in extremely complex integrated circuits.

Moreover, if desired, the moderately thick work function metal may be applied with a high internal stress level, thereby contributing to superior strain conditions in the underlying channel region, while this material may be efficiently removed in the late manufacturing stage upon replacing the stressed work function metal by another work function material that is appropriate for the other type of transistors. For instance, a plurality of materials, which may be used as work function metals, may be deposited with a high internal compressive stress level, which may be advantageous for P-channel transistors in order to induce a compressive strain component in the channel region.

It should be understood that, in the context of this application, a "work function metal" may be understood as any conductive metal-containing material that results in an appropriate work function when formed in or on the gate insulation layer of a gate electrode structure. The "work function metal" does not need to represent a substantially pure metal, but may also enclose any conductive metal-containing compounds, such as metal nitrides and the like, such as titanium nitride, tantalum nitride and the like. Furthermore, the term "work function metal" may also include any material compositions in which certain metal species, such as aluminum, lanthanum and the like, may be incorporated in an appropriate "carrier material" so as to obtain the desired electrical conductivity and the target work function value. For example, aluminum, lanthanum and the like may be diffused into a carrier material, such as titanium nitride, wherein any distinct metal layer, such as an aluminum layer or a lanthanum layer and the like, may not be present in the finished gate electrode structure under consideration.

FIG. 1a schematically illustrates a cross-sectional view of a semiconductor device 100 comprising a substrate 101, such as a silicon substrate, an insulating substrate and the like, above which is a provided a semiconductor layer 102, such as a silicon-based semiconductor material, a silicon/germanium material and the like. It is to be noted, however, that the substrate 101 may represent any appropriate carrier material for providing thereon or therein the semiconductor layer 102, which in turn may be comprised of any appropriate semiconductor material that enables to form therein and thereabove field effect transistors. As previously discussed, silicon-based semiconductor materials may frequently be used for highly complex semiconductor devices that are to be formed on the basis of volume production techniques. The substrate 101 in combination with the semiconductor layer 102 may represent an SOI (silicon- or semiconductor-on-insulator) configuration, when a buried insulating material (not shown) is formed between the substrate 101 and the semiconductor layer 102. In other embodiments, the semiconductor layer 102 represents a portion of a crystalline material of the substrate 101, which may also be referred to as a bulk configuration. Moreover, the semiconductor layer 102 may represent a globally strained semiconductor material, if the global strain is appropriate for enhancing overall performance of the semiconductor device 100.

It should be appreciated that generating a certain type of strain in the channel region of field effect transistors may result in increased charge carrier mobility, which in turn may, thus, enhance transistor performance. For this reason, frequently, one or more strain-inducing mechanisms may be implemented in the overall manufacturing flow for creating strain in P-channel transistors and/or N-channel transistors. For example, for a standard crystallographic configuration of the semiconductor layer 102, a compressive strain component may be advantageous for P-channel transistors, while a tensile strain component may increase performance of N-channel transistors. As will be described later on in more detail, superior strain conditions may also be achieved on the basis of process techniques and material systems described herein.

In the manufacturing stage shown, the semiconductor layer 102 may comprise a plurality of semiconductor regions or active regions 102A, 102B, which are to be understood as any semiconductor regions in and above which one or more transistor elements are to be formed. The active regions 102A, 102B may be laterally delineated by appropriate isolation structures (not shown), such as shallow trench isolations and the like. In one embodiment, the active region 102A may represent the active region of a P-channel transistor, while the active region 102B may represent the active region of an N-channel transistor. In other cases, any other configuration may be used in combination with the present disclosure. In some cases, the active regions 102A and 102B may represent the active regions of non-complementary transistors, which, however, may require different characteristics for the corresponding gate electrode structures that are still to be formed on the active regions 102A, 102B.

Furthermore, a gate layer stack 110 may be formed on the active regions 102A, 102B and may have any appropriate configuration so as to obtain the desired gate electrode characteristics for a transistor to be formed in and above the active region 102A. The gate layer stack 110 may, therefore, comprise a gate dielectric layer 111, which may be comprised of any appropriate material composition so as to provide superior capacitive coupling, while maintaining leakage currents at an acceptable level, as discussed above. The gate dielectric layer 111 may have a dielectric constant that is in total greater than the dielectric constant of conventional dielectric materials, such as silicon dioxide, silicon oxynitride, silicon nitride and the like. Consequently, the gate dielectric material 111 may be referred to as a gate dielectric material comprising a high-k dielectric material. For example, the layer 111 may be provided in the form of two or more individual layers, for instance comprising a silicon dioxide based material layer 111A having a thickness of approximately 1 nm and less, followed by a further dielectric material layer 112A, such as a high-k dielectric material in the form of hafnium oxide, hafnium silicon oxide, zirconium oxide and the like, with a thickness of 0.8 to several nm, depending on the overall device requirements. The gate layer stack 110 may further comprise a work function metal 112A, which may have any appropriate material composition so as to generate the desired work function for a gate electrode structure to be formed from the gate layer stack 110 on the active region 102A. Furthermore, a thickness of the layer 112A, which may also have a significant influence on the finally achieved work function, may be appropriately selected, without requiring any restrictions in view of deposition conditions, as may be the case in conventional replacement gate approaches, in which any work function metal may be deposited into critical gate trenches, as discussed above. Thus, in one illustrative embodiment, the thickness of the work function metal layer 112A, indicated by 112T, may be greater than a thickness of another work function metal that is to be used for a gate electrode structure to be formed on the active region 102B. For example, the work function metal layer 112A may comprise titanium nitride, possibly in combination with an additional metal species, such as aluminum and the like. It should also be appreciated that, if desired, a certain semiconductor material may be provided at a surface of the active region 102A so as to obtain, in combination with the work function metal layer 112A, the desired electronic characteristics.

As discussed above, in some illustrative embodiments, the work function metal 112A may be provided with a high internal stress level in order to create a desired strain component in the active region 102A, while influence of the internal stress level on the active region 102B may be avoided upon removing the material layer 112A in a later manufacturing stage. For example, a plurality of metals and metal nitrides, which may also be understood as metals in the above-defined sense, may be formed with a high internal compressive stress of several Giga Pascal (GPa), which may, thus, contribute to a desired high strain component in the underlying active region 102A. For instance, a high compressive strain component may significantly enhance performance of P-channel transistors.

Furthermore, the gate layer stack 110 may comprise a placeholder material 113, such as a semiconductor material in the form of silicon, silicon/germanium and the like. For instance, providing the placeholder material 113 in the form of silicon may result in a high degree of compatibility with well-established process strategies, since a plurality of patterning strategies have been developed on the basis of silicon material for gate electrode structures. In other cases, the placeholder material may be provided in the form of any other material that may enable an efficient patterning process and which may be efficiently removed in a later manufacturing stage. The placeholder material 113 may be provided in some illustrative embodiments with substantially the same material characteristics above the active region 102A and the active region 102B, for instance in view of the doping level and the like, which may also result in superior process conditions upon patterning the gate layer stack 110. For instance, the layer 113 may be provided as a substantially undoped silicon material or may be provided as a uniformly doped semiconductor material, if required, for instance in view of providing other non-transistor elements, such as resistors and the like, in which the placeholder material 113 may not be removed in a later manufacturing stage. Furthermore, the gate layer stack may comprise additional materials, such as a dielectric cap layer 114, for instance comprised of silicon nitride, silicon dioxide and the like, depending on the overall process strategy.

The semiconductor device 100 as illustrated in FIG. 1a may be formed on the basis of the following processes. The active regions 102A, 102B may be formed on the basis of well-established masking regimes in combination with implantation processes for establishing the basic electronic characteristics of corresponding transistors to be formed in and above the active regions 102A, 102B. Prior to or after establishing an appropriate dopant profile in the regions 102A, 102B, any isolation structures (not shown) may be formed, for instance by forming trenches and refilling the trenches with an insulating material in accordance with any appropriate manufacturing strategy. Thereafter, the gate dielectric material 111 may be formed, for instance by forming the dielectric base layer 111A, for instance in the form of silicon dioxide, silicon oxynitride and the like, based on any appropriate process technique, followed by the deposition of a high-k dielectric material, such as hafnium oxide, thereby forming the layer 112B. Next, the work function metal layer 112A may be deposited, for instance by sputter deposition, chemical vapor deposition (CVD) and the like, wherein any desired material composition may be formed. For example, aluminum, lanthanum and the like, depending on the type of transistor to be formed, may be deposited in combination with titanium nitride and the like. As discussed above, the thickness 112T may also be appropriately selected so as to obtain the desired work function, thereby providing a high degree of flexibility in tuning the electronic characteristics of the gate electrode structure still to be formed from the layer stack 110. Thereafter, the placeholder material 113 may be formed, for instance by well-established low pressure CVD techniques, when a silicon material is considered, wherein, if desired, an appropriate dopant concentration may be established, if required, as discussed above. Thereafter, additional materials, such as the layer 114, may be formed, followed by any further materials, such as hard mask materials and the like, as required for the subsequent patterning of the gate layer stack 110.

Figure 1B:
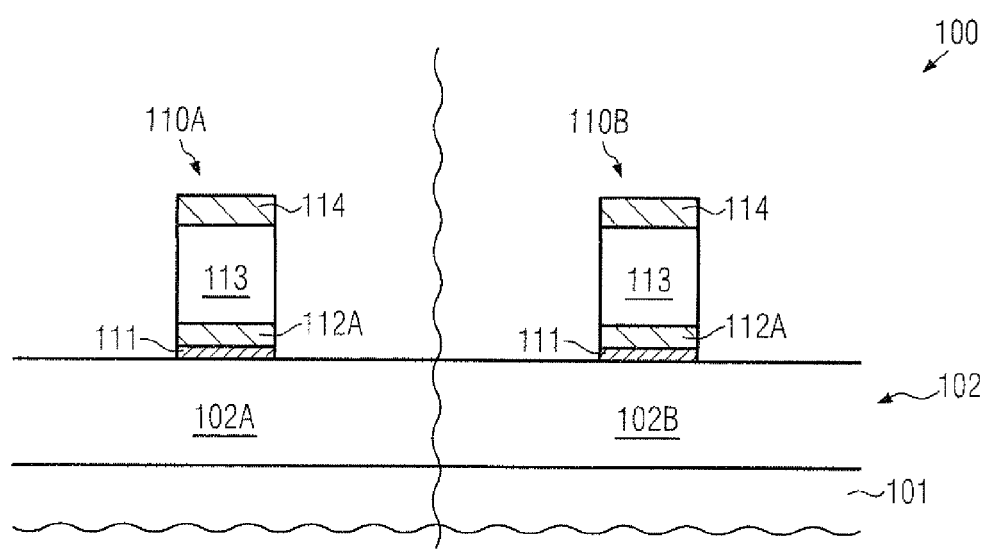

FIG. 1b schematically illustrates the semiconductor device 100 in a further advanced manufacturing stage. As illustrated, a first gate electrode structure 110A is formed on the active region 102A and a second gate electrode structure 110B is formed on the active region 102B, wherein the structures 110A, 110B have substantially the same configuration. That is, the layers 111, 112A, 113 and 114 may be provided in both gate electrode structures 110A, 110B, wherein the layer 112A has a work function that is appropriate for a transistor still to be formed on the basis of the gate electrode structure 110A.

The gate electrode structures 110A, 110B, may be formed from the gate layer stack 110 as shown in FIG. 1a by using appropriate lithography and etch strategies, for instance by using hard mask materials, such as amorphous carbon, silicon oxynitride and the like, and by patterning these hard mask materials using sophisticated lithography techniques. Thereafter, the gate layer stack may be patterned on the basis of anisotropic etch recipes, wherein the gate electrode structures 110A, 110B, may be formed with a high degree of uniformity with respect to the critical dimensions or any other patterning-related irregularities due to the same configuration above the active region 102A and 102B. For example, the etch chemistries used to pattern the placeholder material 113 may be sensitive to dopant concentrations and the like, so that a similar cross-sectional shape of the gate electrode structures 110A, 110B may be obtained due to uniform material characteristics of the layer 113. Similarly, the patternings of the remaining material layers may result in substantially the same etch profile, thereby providing the structures 110A, 110B with a high degree of similarity. Consequently, the processing of the device may be continued on the basis of superior process conditions when forming the basic configuration of transistor elements.

Thus, due to the superior patterning conditions, critical dimensions, such as the gate length, i.e., in FIG. 1b, the horizontal extension of the materials 112A and 111 of 40 nm and less, may be achieved with reduced variability compared to conventional approaches.

Figure 1C:
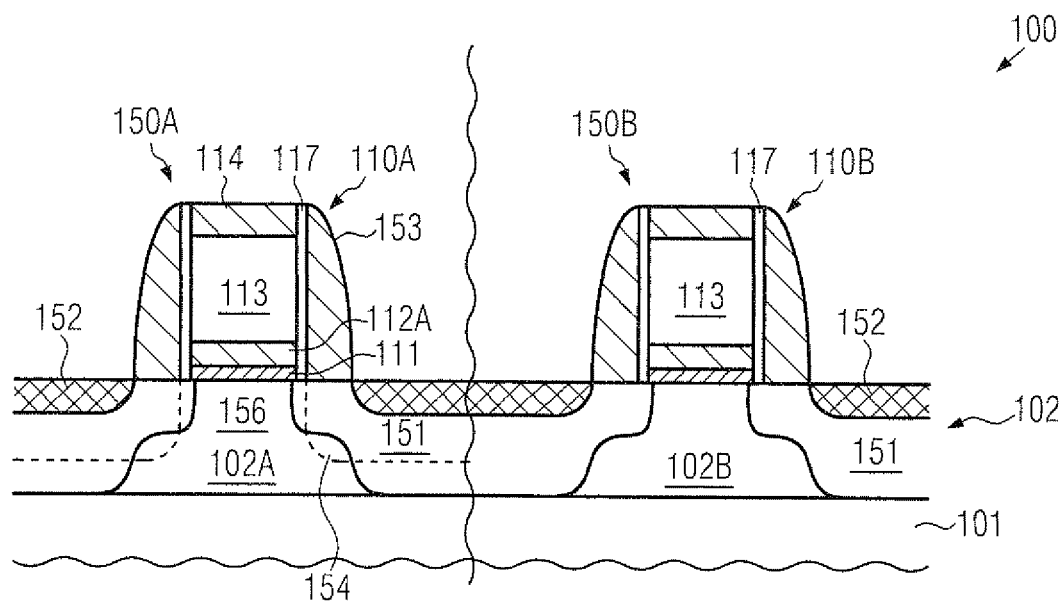

FIG. 1c schematically illustrates the semiconductor device 100 in a further advanced manufacturing stage. As shown, a first transistor 150A may be formed in and above the active region 102A and may comprise the gate electrode structure 110A. The transistor 150A may represent, in one illustrative embodiment, a P-channel transistor, as is also discussed above. A second transistor 150B may be formed in and above the active region 102B and may represent an N-channel transistor, and may comprise the gate electrode structure 110B. The gate electrode structures 110A, 110B may additionally comprise a spacer or liner 117, such as a silicon nitride material, which may confine the sensitive materials 111 and 112A so as to avoid undue modifications of the material characteristics, at least in the gate electrode structure 110A. The transistors 150A, 150B may comprise a sidewall spacer structure 153 formed on the sidewalls of the gate electrode structures 110A, 110B. The spacer structure 153 may have any appropriate configuration, for instance with respect to the number of individual spacer elements and corresponding etch stop liners, if required, depending on the overall process strategy. Moreover, the transistors 150A, 150B may comprise drain and source regions 151 having an appropriate dopant profile, as discussed above. It should be appreciated that the drain and source regions 151 are of inverse conductivity type in the transistors 150A and 150B when representing complementary transistors. The drain and source regions 151 are laterally separated by a channel region 156, which in turn connects to the gate dielectric material 111. Moreover, metal silicide regions 152 may be provided in a part of the drain and source regions 151, thereby reducing the overall series resistance in the transistors 150A, 150B and also reducing the contact resistance when forming contact elements in a later manufacturing stage. In some illustrative embodiments, as shown by dashed lines in FIG. 1c, the transistor 150A may comprise a strain-inducing mechanism based on a strain-inducing semiconductor alloy 154, such as a silicon/germanium alloy and the like. For instance, as discussed above, a compressive strain component may increase the charge carrier mobility in the channel region 156, when the transistor 150A represents a P-channel transistor.

The semiconductor device 100 as illustrated in FIG. 1c may be formed on the basis of the following processes. After patterning the gate electrode structures 110A, 110B, as shown in FIG. 1b, the protective liner or spacer 117 may be formed by well-established deposition techniques, such as low pressure CVD, multiple layer deposition techniques and the like. If the semiconductor alloy 154 is to be selectively provided in the active region 102A, a corresponding hard mask layer may be formed so as to cover the transistor 150B, while additional spacer elements may also be formed at the gate electrode structure 110A, if required. Thereafter, recesses or cavities may be formed and may be refilled on the basis of selective epitaxial growth techniques, thereby providing the material 154, if required. Next, any sacrificial materials may be removed and the further processing may be continued by forming a portion of the spacer structure 153 based on an appropriate masking and implantation regime for introducing dopants for the drain and source regions 151. Upon completing the implantation processes, any high temperature processes may be performed so as to activate the dopant species and re-crystallize implantation-induced damage, thereby obtaining the final dopant profile of the drain and source regions 151. Next, the metal silicide regions 152 may be formed on the basis of well-established silicidation techniques, wherein, as illustrated, in some illustrative embodiments, the cap layer 114 may still be in place and may, thus, avoid the formation of any metal silicide in the placeholder material 113, when comprised of a silicon material.

Figure 1D:
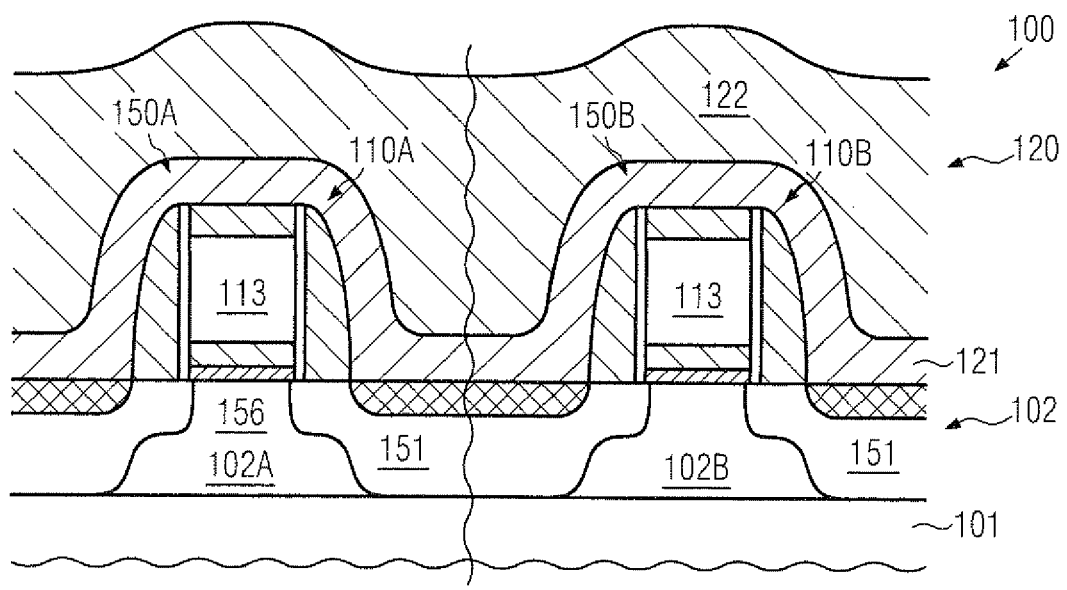

FIG. 1d schematically illustrates the semiconductor device 100, in which a portion of an interlayer dielectric material 120 may be formed above and laterally adjacent to the gate electrode structures 110A, 110B. The interlayer dielectric material 120 may have any appropriate configuration and may, for instance, include two or more material layers. For example, a first dielectric layer 121, such as a silicon nitride material and the like, may be provided in combination with a further dielectric material 122, such as a silicon dioxide material. It should be appreciated, however, that the materials 121, 122 are of illustrative nature only and any other composition of the interlayer dielectric material 120 may be selected in accordance with the overall device requirements. It should be noted that a portion of the interlayer dielectric material 120 or the entire material may be provided so as to have a high internal stress level, which may, thus, enhance performance of one or both of the transistors 150A, 150B. For instance, the dielectric material 121 may be provided with high internal stress, which may be different for the transistors 150A, 150B. The interlayer dielectric material 120 may be formed on the basis of any appropriate process techniques, for instance, depositing the material 122 by using plasma enhanced CVD techniques, followed by the deposition of the material 121 having a superior gap filling behavior, for instance by depositing silicon dioxide material using thermally activated or plasma enhanced CVD techniques.

Figure 1E:
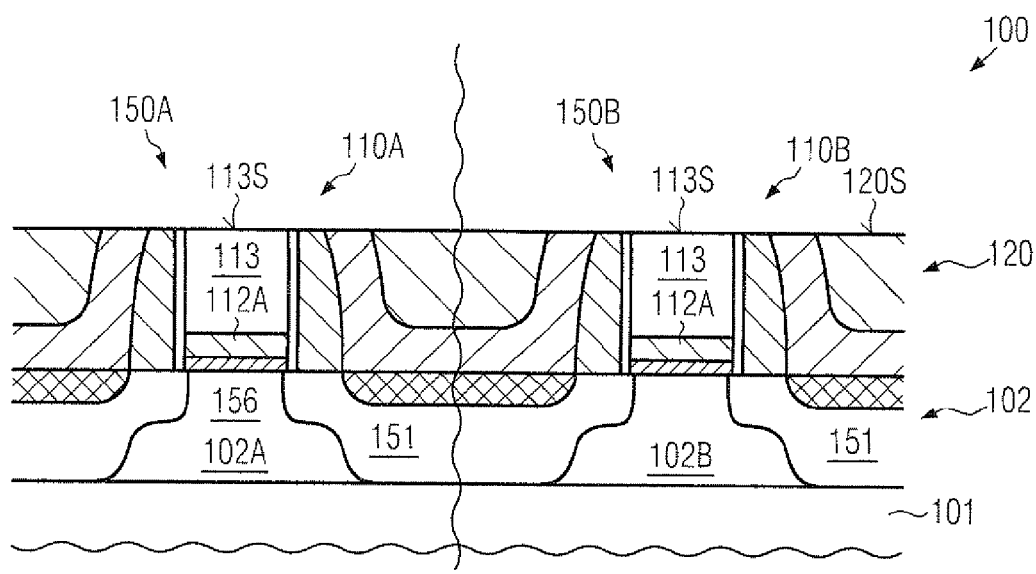

FIG. 1e schematically illustrates the semiconductor device 100 in a further advanced manufacturing stage. As illustrated, the interlayer dielectric material 120 may be planarized so as to have a substantially planar surface 120S, which may be accomplished by performing any appropriate planarization process, such as a chemical mechanical polishing (CMP) process and the like. Furthermore, upon planarizing the material 120, a surface 113S of the placeholder material 113 may also be exposed, which may also be accomplished by a CMP process. It should be appreciated that the very similar configurations of the gate electrode structures 110A, 110B may also provide superior process uniformity and robustness with respect to any process variations upon exposing the surface areas 113S when planarizing the material 120. That is, any differences in height level between the gate electrode structures 110A, 110B may be reduced due to the superior uniformity during the previous processing of the device 100 achieved by substantially the same configuration of the gate electrode structures 110A, 110B. Furthermore, a desired increased height of the gate electrode structures 110A, 110B may initially be provided and may also be preserved throughout the planarizing process for exposing the surface areas 113S due to the superior uniformity and due to the fact that, in the further processing, only one work function metal has to be provided for the gate electrode structure 110B.

Figure 1F:
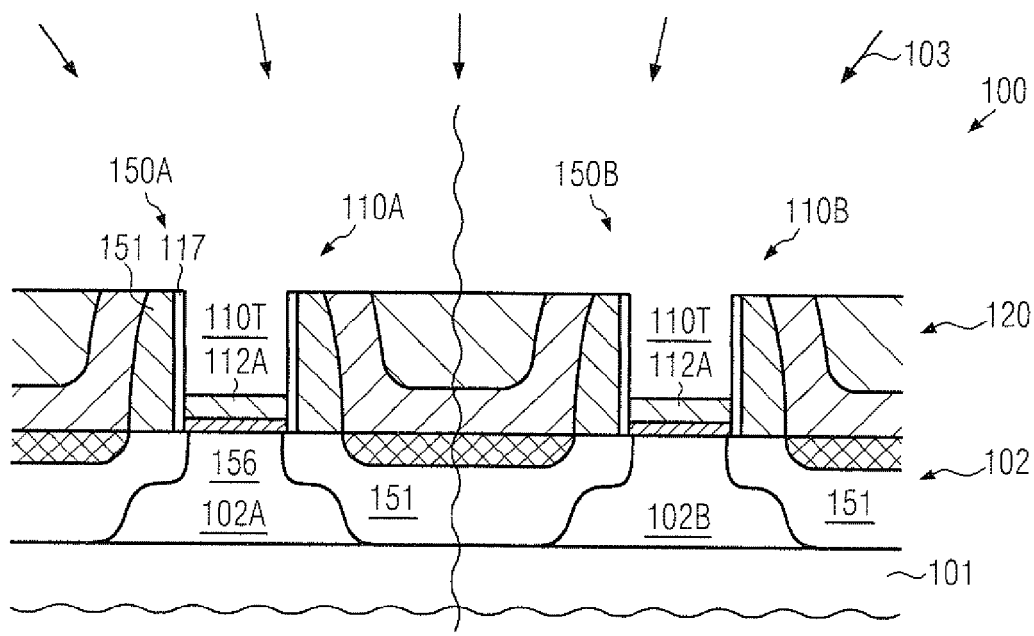

FIG. 1f schematically illustrates the semiconductor device 100 when exposed to an etch ambient 103, in which appropriate etch chemistries may be applied so as to selectively remove the placeholder material 113 (FIG. 1e), while the remaining dielectric materials, such as the material 120, the spacer 151, in combination with the liner 117, may act as efficient etch stop materials. For this purpose, a plurality of wet chemical etch recipes or plasma assisted etch processes, possibly in combination with wet chemical etch recipes, are available for removing silicon-based material. Moreover, at least at a final phase of the etch process 103, the work function metal layer 112A may act as an efficient etch stop material, wherein any material consumption may be less critical and may be taken into consideration by appropriately selecting the initial thickness of the layer 112A. For instance, wet chemical etch recipes, such as TMAH (tetra methyl ammonium hydroxide), may have a significantly reduced etch rate for a plurality of "metals," such as titanium nitride and the like. Consequently, upon removing the placeholder material, thereby forming gate openings or trenches 110T, the work function metal 112A may be exposed, however, without unduly affecting the overall work function characteristics of the gate electrode structure 110A, since any material loss may be taken into account by appropriately setting the initial layer thickness.

Figure 1G:
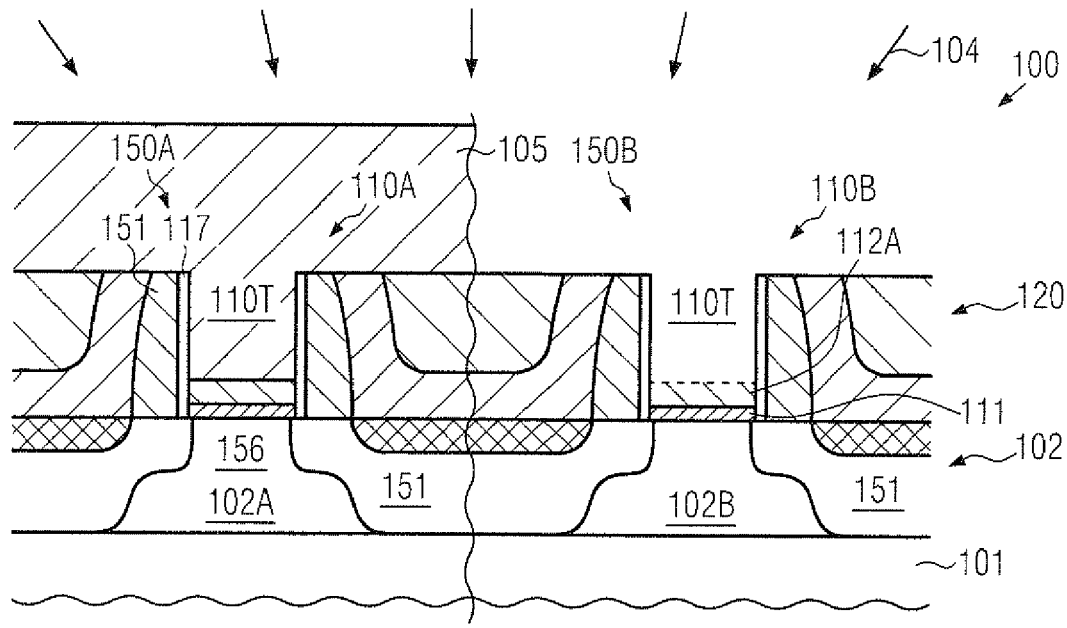

FIG. 1g schematically illustrates the semiconductor device 100 with an etch mask 105 formed above the gate electrode structure 110A, thereby also filling the corresponding trench 110T. On the other hand, the gate electrode structure 110B may remain non-covered, thereby exposing the work function metal 112A to an etch ambient 104 that may be established on the basis of wet chemical etch chemistries and the like, in order to remove the material 112A in the trench 110T of the gate electrode structure 110B. To this end, the plurality of wet chemical cleaning recipes are available for etching, for instance, titanium nitride and the like, wherein the gate insulation layer 111 may act as an efficient etch stop layer. It should be appreciated that, in particular, high-k dielectric materials, such as hafnium oxide, may have a high etch resistivity with respect to a plurality of etch chemistries, thereby avoiding undue material loss in the layer 111 of the gate electrode structure 110B.

The etch mask 105 may be provided in the form of any appropriate material, such as a polymer material, which may be patterned on the basis of lithography techniques, while, in other cases, any other hard mask materials may be used, as long as these materials may be efficiently removed from the trench 110T of the gate electrode structure 110A.

Figure 1H:
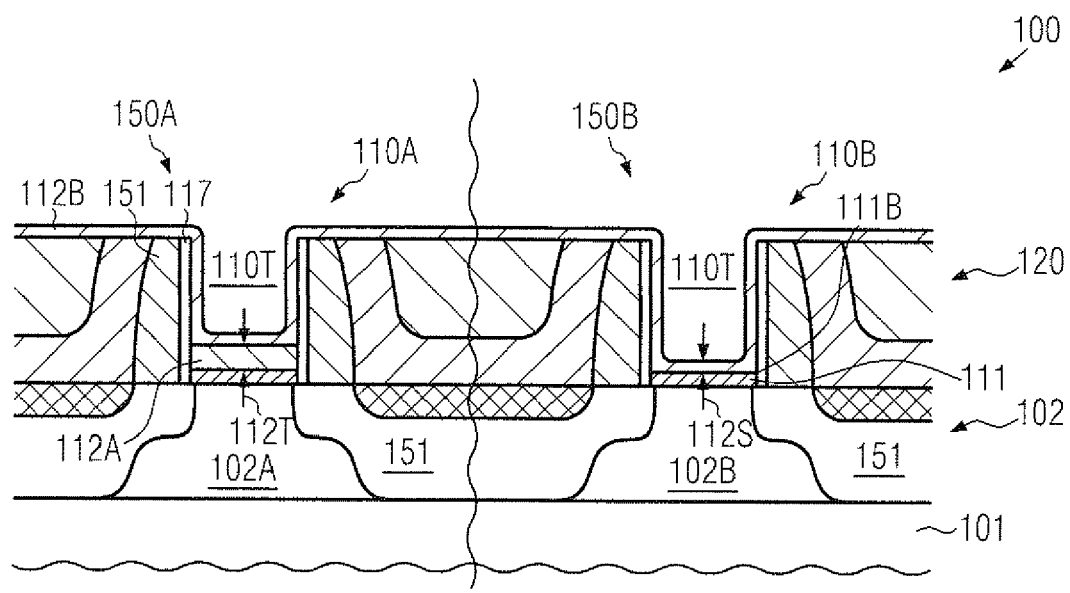

FIG. 1h schematically illustrates the semiconductor device 100 with a work function metal layer 112B formed above the dielectric material 120 and within the trenches 110T of the gate electrode structures 110A, 110B. The work function metal layer 112B may be comprised of any appropriate metal-containing material resulting in the desired work function for the gate electrode structure 110B. For instance, lanthanum and the like may be deposited in order to obtain a desired work function for the gate electrode structure 110B, when representing a gate electrode structure of an N-channel transistor. The deposition of the work function metal 112B may be accomplished by any appropriate deposition technique, such as CVD, sputter deposition and the like. For instance, if desired, any deposition techniques may be applied in which material may be preferably deposited on horizontal device areas, while a deposition at substantially vertical areas may be restricted in order to obtain a desired layer thickness 112S in particular at a bottom of the opening 110T of the gate electrode structure 110B, thereby providing the desired work function. It should be appreciated that, in some illustrative embodiments, the thickness 112S of the layer 112B may be less than the thickness 112T of the work function metal layer 112A, thereby enabling superior process parameters during the deposition of the layer 112B and also providing superior process conditions during the subsequent deposition of the actual electrode metal, as is also discussed above. Consequently, in the embodiment shown, the work function metal layer 112B may be formed directly on the work function metal 112A in the gate electrode structure 110A and may be directly formed on the gate insulation layer 111, i.e., for instance on the high-k dielectric material 111B, in the gate electrode structure 110B.

Figure 1I:
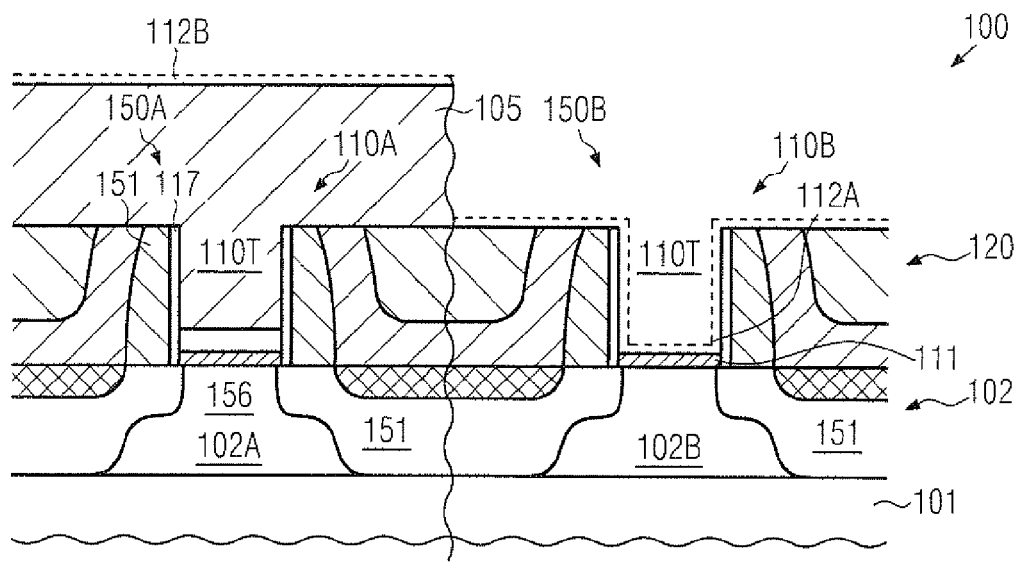

FIG. 1i schematically illustrates the semiconductor device 100 according to illustrative embodiments in which the etch mask 105 may still be in place, i.e., the gate electrode structure 110A may still be covered by the mask 105 when depositing the work function metal layer 112. For this purpose, the etch mask 105 may be provided in the form of a polymer material and the like which may be readily removed upon elevated temperatures and the like, thereby enabling an efficient removal together with the material 112B formed thereon. For example, the etch mask 105 may be efficiently removed by laser radiation, during which the material 105 may be "evaporated," while the layer 112B having a thickness of 0.8 nm to several nm, may essentially not affect the energy deposition into the material 105. Consequently, the material 105 may be removed without significantly influencing other device areas.

Figure 1J:
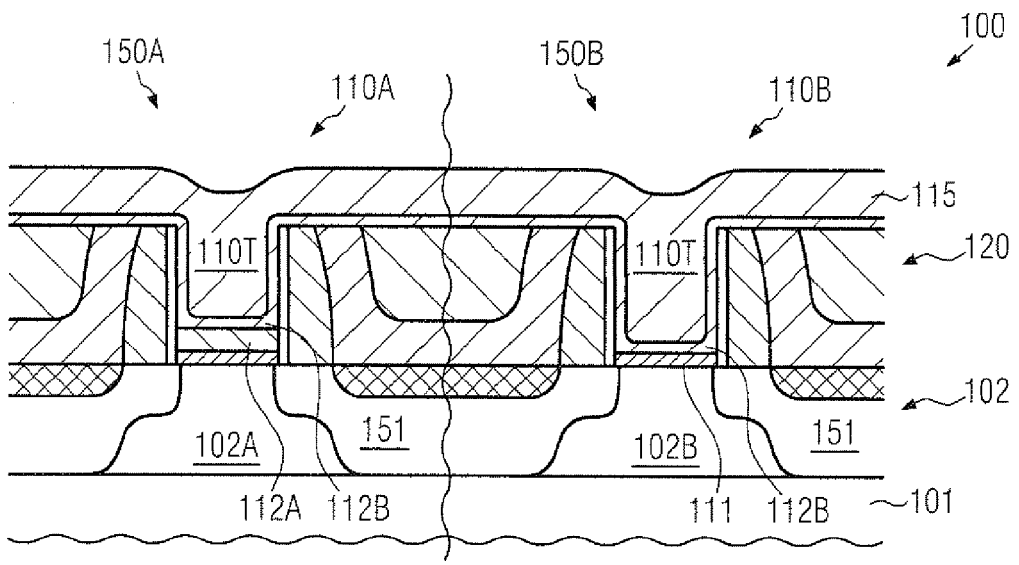

FIG. 1j schematically illustrates the semiconductor device 100 in a further advanced manufacturing stage in which an electrode metal or any other highly conductive material 115 may be formed above the gate electrode structures 110A, 110B and, thus, within the gate openings 110T. In the embodiment shown, the material 115 may be in contact with the work function metal material 112B within the gate electrode structure 110A, when starting from the configuration as shown in FIG. 1h. In other illustrative embodiments (not shown), the material 115 may be formed directly on the work function metal 112A, when performing the deposition process on the basis of a device configuration as shown in FIG. 1i. On the other hand, the material 115 may be formed on the work function metal 112B in the gate electrode structure 110B. For example, the electrode metal 115 may be provided in the form of aluminum and the like, depending on the overall process strategies. As previously explained, the material 115 may be deposited on the basis of any appropriate deposition technique, such as CVD, electrochemical deposition, sputter deposition or any combination of these techniques, wherein a width of the gate openings 110T may be restricted by the work function material 112B only, thereby ensuring superior deposition conditions.

Figure 1K:
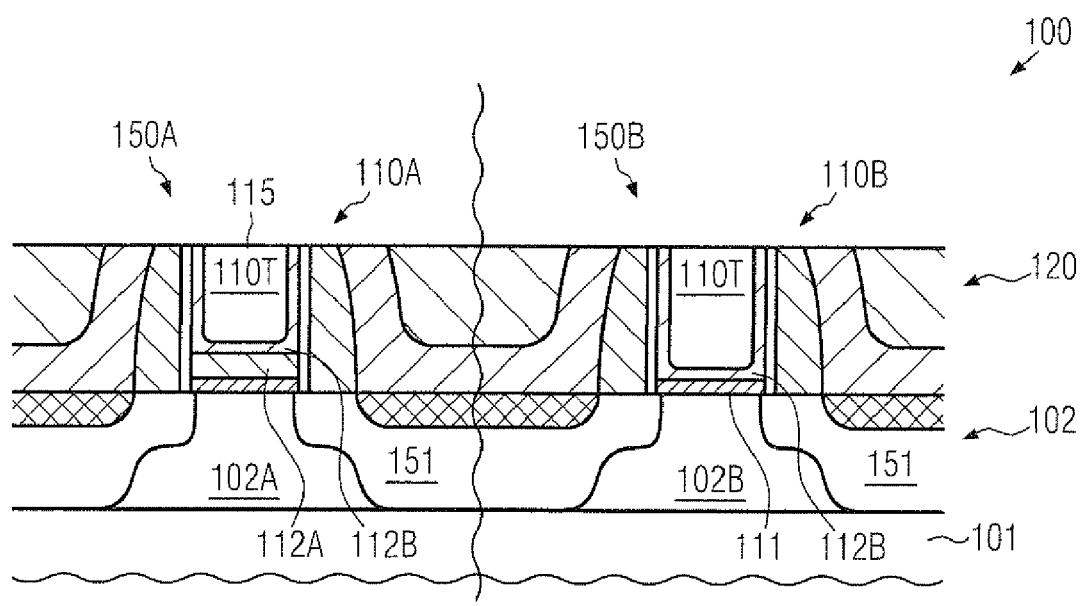

FIG. 1k schematically illustrates the semiconductor device 100 after the removal of any excess material, which may be accomplished by CMP and the like. Consequently, the gate electrode structures 110A, 110B may comprise the electrode metal 115 with superior uniformity and with reduced deposition-related irregularities due to the superior deposition conditions. Consequently, the transistor 150A may comprise the gate electrode structure 110A having the work function as defined by the work function metal 112A, which may have an appropriate thickness so as to avoid a significant influence of the material 112B, if provided in the gate electrode structure 110A. On the other hand, the transistor 150B comprises the gate electrode structure 110B, whose work function is determined by the work function metal 112B, which may be in direct contact with the gate insulation layer 111.

Thereafter, the further processing may be continued by depositing a further dielectric material and patterning the same so as to form contact elements for connecting to the drain and source regions 151 and to the gate electrode structures 110A, 110B, in accordance with the overall circuit layout of the device 100.

As a result, the present disclosure provides semiconductor devices and manufacturing techniques in which a replacement gate approach may be applied so as to provide high-k metal gate electrode structures, wherein the deposition of work function metal may be performed in a very early manufacturing stage, i.e., upon forming a gate layer stack. Consequently, the deposition conditions for forming the further work function metal species and/or for providing the actual electrode metal may be improved, which may translate into superior uniformity of transistor characteristics, such as threshold voltage and the like.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a first gate electrode structure of a first transistor and a second gate electrode structure of a second transistor from a gate layer stack comprising a semiconductor material, a high-k dielectric material and a first work function metal layer for adjusting a work function of said first gate electrode structure;
    removing said semiconductor material from said first and second gate electrode structures so as to expose said first work function metal layer in said first and second gate electrode structures;
    removing said first work function metal layer from said second gate electrode structure;
    forming a second work function metal layer in said second gate electrode structure; and
    forming a conductive electrode material in said first and second gate electrode structures after forming said second work function metal layer.

2. The method of claim 1, wherein removing said first work function metal layer from said second gate electrode structure comprises exposing a surface of said first work function metal layer in said first and second gate electrode structures and forming a mask so as to cover said first gate electrode structure.

3. The method of claim 1, wherein forming said second work function metal layer comprises depositing a layer of said second work function metal on said first work function metal in said first gate electrode structure and on said high-k dielectric material in said second gate electrode structure.

4. The method of claim 2, wherein forming said second work function metal layer comprises depositing a layer of said second work function metal in the presence of said mask.

5. The method of claim 1, further comprising forming a portion of an interlayer dielectric material laterally adjacent to said first and second gate electrode structures prior to removing said semiconductor material from said first and second gate electrode structures.

6. The method of claim 1, wherein said first work function metal layer has a thickness that is greater than a thickness of said second work function metal layer.

7. The method of claim 1, wherein said first transistor is a P-channel transistor and said second transistor is an N-channel transistor.

8. A method of forming a semiconductor device, the method comprising:
    forming a gate layer stack above a first active region of a first transistor and a second active region of a second transistor, said gate layer stack comprising a high-k gate dielectric material, a first work function metal formed on said high-k gate dielectric material, and a placeholder material formed above said first work function metal;
    forming a first gate electrode structure on said first active region and a second gate electrode structure on said second active region from said gate layer stack;
    exposing said first work function metal in said first and second gate electrode structures by removing said placeholder material from said first and second gate electrodes;
    replacing said first work function metal in said second gate electrode structure with a second work function metal that differs from said first work function metal; and
    forming an electrode metal in said first and second gate electrode structures.

9. The method of claim 1, further comprising forming a mask so as to cover said first gate electrode structure after removing said placeholder material from said first and second gate electrode structures and prior to replacing said first work function metal in said second gate electrode structure.

10. The method of claim 1, wherein replacing said first work function metal in said second gate electrode structure comprises depositing said second work function metal above said first work function metal in said first gate electrode structure.

11. The method of claim 9, wherein replacing said first work function metal in said second gate electrode structure comprises depositing said second work function metal in the presence of said mask.

12. The method of claim 8, wherein said first work function metal is formed with a first thickness and said second work function metal is formed with a second thickness that is less than said first thickness.

13. The method of claim 8, wherein said first transistor is a P-channel transistor and said second transistor is an N-channel transistor.

14. The method of claim 8, wherein forming said gate layer stack comprises forming said first work function metal with a high internal stress level so as to induce a strain in said first active region.

15. The method of claim 14, further comprising implementing a strain-inducing mechanism in at least one of said first and second transistors.

16. The method of claim 1, wherein removing said semiconductor material from said first and second gate electrode structures comprises removing a cap layer from above said first and second gate electrode structures.

17. The method of claim 1, wherein removing said semiconductor material from said first and second gate electrode structures comprises removing said semiconductor material from said first and second gate electrode structures in a common material removal process.

18. The method of claim 8, wherein removing said placeholder material from said first and second gate electrode structures comprises exposing said placeholder material in said first and second gate electrode structures during a common material exposure process.

19. The method of claim 18, wherein exposing said placeholder material in said first and second gate electrode structures during said common material exposure process comprises performing a planarization process.

20. The method of claim 18, wherein a cap layer is removed from said first and second gate electrode structures during said common material exposure process.

* * * * *